(12) United States Patent
Kim et al.

(10) Patent No.: US 7,294,546 B2
(45) Date of Patent: Nov. 13, 2007

(54) CAPACITOR FOR A SEMICONDUCTOR DEVICE AND METHOD OF FABRICATING SAME

(75) Inventors: Hong-Ki Kim, Kyunggi-do (KR); Ho-Kyu Kang, Yongin-shi (KR); Moon-Han Park, Yongin-shi (KR); Myong-Geun Yoon, Seoul (KR); Seok-Jun Won, Seoul (KR); Yong-Kuk Jeong, Seoul (KR); Kyung-Hun Kim, Kyunggi-do (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 11/519,615

(22) Filed: Sep. 12, 2006

(65) Prior Publication Data

US 2007/0004133 A1    Jan. 4, 2007

Related U.S. Application Data

(62) Division of application No. 10/629,336, filed on Jul. 29, 2003, now abandoned.

(30) Foreign Application Priority Data

Jul. 30, 2002    (KR) .............................. 2002-44986

(51) Int. Cl.
*H01L 21/8242*    (2006.01)

(52) U.S. Cl. ...................................... 438/253; 438/396
(58) Field of Classification Search ................ 438/253, 438/255, 397, 398, 643, 396
See application file for complete search history.

(56) References Cited

U.S. PATENT DOCUMENTS 6,238,964 B1 *  5/2001  Cho ............................ 438/240
6,303,490 B1 * 10/2001  Jeng ........................... 438/627

FOREIGN PATENT DOCUMENTS

KR            2755           1/2002

* cited by examiner

*Primary Examiner*—Tuan H. Nguyen
(74) *Attorney, Agent, or Firm*—F. Chau & Assoc., LLC (57) ABSTRACT

A capacitor includes an upper electrode formed by physical vapor deposition and chemical vapor deposition. The upper electrode of the capacitor may include a first upper electrode formed by chemical vapor deposition and a second upper electrode formed by physical vapor deposition. Alternatively, the upper electrode may include a first upper electrode formed by physical vapor deposition and a second upper electrode formed by chemical vapor deposition. The upper electrode of the capacitor is formed through two steps using chemical vapor deposition and physical vapor deposition. Therefore, the upper electrode can be thick and rapidly formed, whereby electrical characteristics of the upper electrode are not deteriorated.

9 Claims, 7 Drawing Sheets

CAPACITOR FOR A SEMICONDUCTOR DEVICE AND METHOD OF FABRICATING SAME

CROSS REFERENCE TO RELATED APPLICATION

This application is a Divisional of U.S. patent application Ser. No. 10/629,336 filed on Jul. 29, 2003 now abandoned, and which claims priority to Korean Patent Application No. 2002-44986, filed Jul. 30, 2002 in the Korean Intellectual Property Office (KIPO), both of which are fully incorporated herein by reference.

FIELD OF THE INVENTION

The present invention relates to a capacitor for a semiconductor device and a method of fabricating same. More specifically, the invention is directed to a capacitor for a semiconductor device having upper electrodes formed by physical vapor deposition (PVD) as well as chemical vapor deposition (CVD) and a method for fabricating same.

BACKGROUND OF THE INVENTION

As semiconductor devices continue to be scaled down, the area of a memory cell becomes smaller. Although the memory cell is smaller, capacitor area has not been reduced because of a need to maintain appropriate levels of capacitance. For example, a unit cell needs an appropriate charge capacitance for durability against the soft error caused by α-particles and a sensing signal margin.

A number of alternatives for maintaining a capacitance of a memory capacitor beyond a predetermined value are known. In accordance with the equation $C=\in As/d$ ($C$ being a capacitance, $\in$ being a dielectric constant, $As$ being a surface area of an electrode, and $d$ being a thickness of a dielectric film), a first approach has been to reduce the surface area of a dielectric film ($d$). A second approach has been to increase the surface area of an electrode ($As$), and a third approach has been to use a material having a high dielectric constant ($\in$).

A problem with the first approach is that as the thickness of a dielectric film is reduced, leakage current increases. As a result, the second and third approaches have been used more often than the first. In the second approach, when the surface area of an electrode is increased, a capacitor structure is transformed into a three dimensional (3D) structure such as, for example, a simple stack structure, a concave structure, a cylindrical structure, and a multi-fin structure. The third approach uses a material with a high dielectric constant such as, for example, $(Ba,Sr)TiO_3(BST)$, $(Pb,Zr)TiO_3(PZT)$, and $Ta_2O_5$.

As a result of the second approach, a capacitor having a cylindrical (or concave) structure has been suggested to overcome a difficulty in etching a lower electrode as the height of a 3-dimensionally stacked capacitor increases.

A semiconductor device with a conventional concave-type capacitor is now described below with reference to FIG. 1 in which reference numerals 70 and 80 denote a cell region and a peripheral circuit region, respectively.

Figure 1:
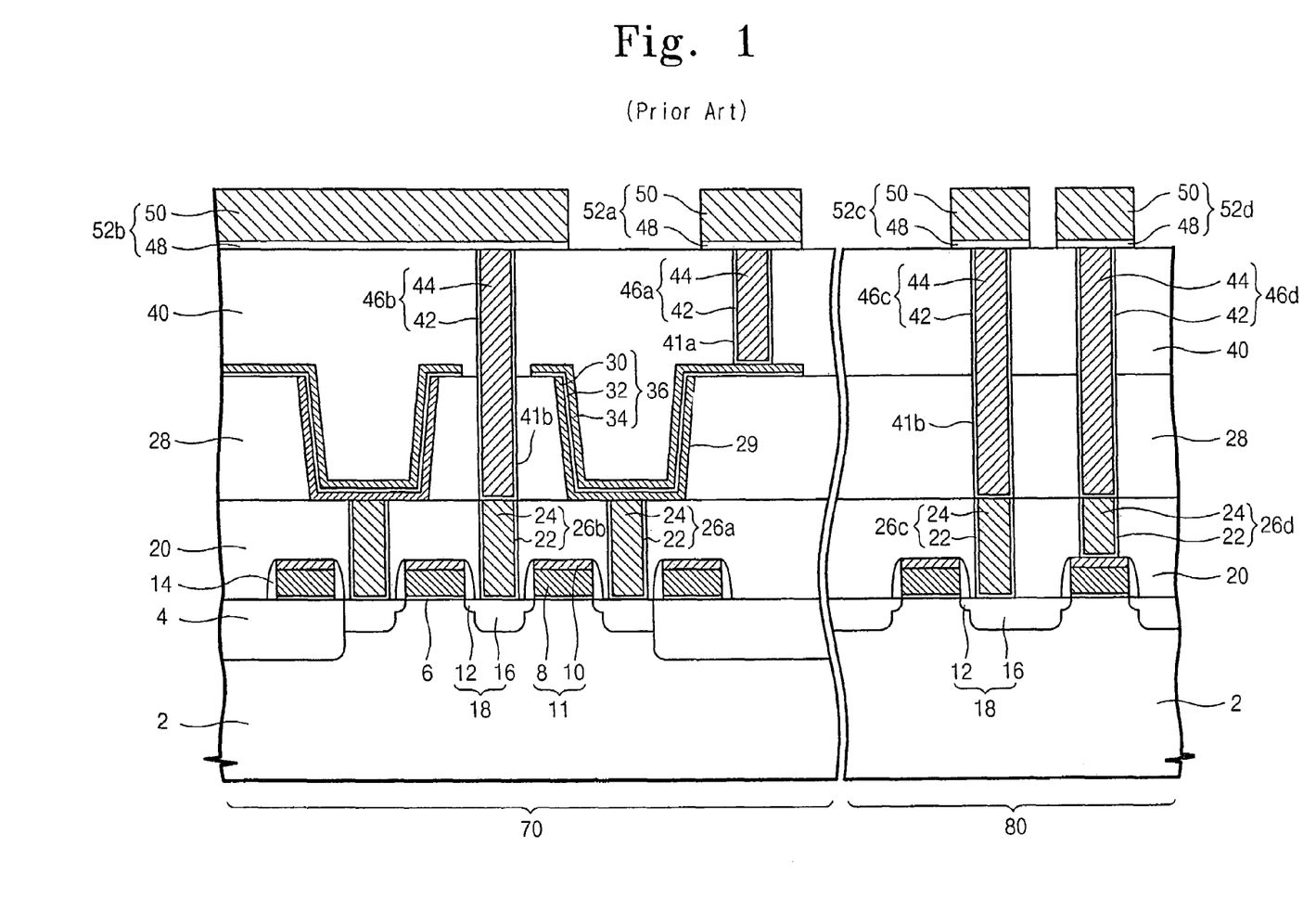
FIG. 1 is a cross-sectional view of a semiconductor device including a conventional concave-type capacitor.

Referring to FIG. 1, in the cell region 70 and peripheral circuit region 80, a MOS transistor is disposed on a substrate 2 where a device isolation region 4 is formed. The MOS transistor has a gate electrode 11 and a source/drain region 18. The gate electrode 11 has a polysilicon layer 8 and a silicide layer 10 formed on a gate insulating layer 6. A spacer 14 is formed on sidewalls of the gate electrode 11. The source/drain region 18 includes a lightly doped region 12 and a heavily doped region 16.

A first interlayer dielectric 20 is stacked on the substrate 2 including the MOS transistor. Contacts 26a, 26b, and 26c are connected to the source/drain region 18 of the MOS transistor through the first interlayer dielectric 20. A contact 26d is coupled to the gate electrode 11. Each of the contacts 26a, 26b, 26c, and 26d includes barrier metal 22 and a tungsten layer 24.

A second interlayer dielectric 28 is stacked on a first interlayer dielectric 20 including the contacts 26a, 26b, 26c, and 26d. In the cell region 70, a concave hole 29 is formed to expose the contact 26a through the second interlayer dielectric 28. A capacitor 36 coupled to the contact 26a is disposed in the concave hole 29. The capacitor 36 consists of a lower electrode 30, a dielectric film 32, and an upper electrode 34.

In the cell region 70, a third interlayer dielectric 40 is stacked on the second interlayer dielectric 28 including the capacitor 36. In the peripheral circuit region 80, a second interlayer dielectric 28 and a third interlayer dielectric 40 are sequentially stacked.

In the cell region 70, a contact 46a is electrically connected to the upper electrode 34 of the capacitor 36 through the third interlayer dielectric 40. The contact 46a is coupled to an interconnection 52a. A bitline contact 46b is electrically connected to the contact 26b through the third interlayer dielectric 40 and the second interlayer dielectric 28. The bitline contact 46b is coupled to a bitline 52b. In the peripheral circuit region 80, contacts 46c and 46d are formed to be electrically connected to the contacts 26c and 26d through the third interlayer dielectric 40 and the second interlayer dielectric 28. The contacts 46c and 46d are coupled to interconnections 52c and 52d, respectively. The contacts 46a, 46b, 46c and 46d consist of barrier metal 42 and a tungsten layer 44. The bitline 52b includes barrier metal 48 and a conductive layer 50. Similarly, each of the interconnections 52a, 52c, and 52d includes barrier metal 48 and a conductive layer 50.

In a semiconductor device having a concave-type (or cylindrical) capacitor in a capacitor under bitline (CUB) structure, the contacts 46a, 46b, 46c, and 46d may be formed by the following method: the third interlayer 40 dielectric is etched to form an opening 41a exposing a surface of the upper electrode 34, and the third interlayer dielectric 40 and the second dielectric 28 are successively etched to form openings 41b exposing the contacts 26b, 26c, and 26d.

Since the openings 41b exposing the contacts 26b, 26c, and 26d are deeper than the opening 41a exposing the upper electrode 34, the upper electrode 34 may be overetched. Accordingly, there is a need for a method of rapidly forming a thick upper electrode in order to enhance a yield.

In addition, data stored in a dynamic random access memory (DRAM) cell is maintained as an amount of charge stored in a capacitor and is retained by means of regular refresh operations. To normally operate DRAM, the stored charges must not be lost during the refresh operations. Accordingly, there is a need for a capacitor which eliminates leakage current.

SUMMARY OF THE INVENTION

A capacitor, in accordance with the present invention, includes a lower electrode formed on a semiconductor substrate, a dielectric film stacked on the lower electrode, and an upper electrode formed on the dielectric film, wherein the upper electrode is formed by chemical vapor deposition (CVD) and physical vapor deposition (PVD).

In alternate embodiments, the upper electrode may be made of one selected from the group consisting of titanium nitride, tantalum nitride, tungsten nitride, ruthenium, platinum, iridium, and a combination thereof. The upper electrode may consist of a first upper electrode formed by chemical vapor deposition and a second upper electrode formed by physical vapor deposition. Alternatively, the first upper electrode may be formed by physical vapor deposition and the second upper electrode formed by chemical vapor deposition. The first upper electrode and the second upper electrode may be sequentially stacked. The capacitor may be a concave-type capacitor.

A method for fabricating a capacitor, in accordance with the present invention, includes forming a lower electrode on a semiconductor substrate, forming a dielectric film on the lower electrode, and forming an upper electrode by chemical vapor deposition and physical vapor deposition.

In other methods, the upper electrode may be made of one selected from the group consisting of titanium nitride, tantalum nitride, tungsten nitride, ruthenium, platinum, iridium, and a combination thereof. The step of forming the upper electrode may include forming a first upper electrode by the chemical vapor deposition, and forming a second upper electrode by the physical vapor deposition or vice versa. When the first upper electrode is formed by the physical vapor deposition, a bias power may be applied only to a target and no bias power is applied to the semiconductor substrate.

Another method for fabricating a capacitor, in accordance with the present invention, includes forming an interlayer dielectric on a semiconductor substrate where a conductive region is formed, selectively etching the interlayer dielectric to form a concave hole exposing the conductive region, forming a lower electrode conductive layer in the concave hole and on the interlayer dielectric, patterning the lower electrode conductive layer to form a lower electrode pattern on a bottom and a sidewall of the concave hole, forming a dielectric film on the lower electrode pattern, forming a first upper electrode on the dielectric film by physical vapor deposition, and forming a second upper electrode on the first upper electrode.

In alternate methods, when the first upper electrode is formed by physical vapor deposition, a bias power may be applied only to a target and no bias power is applied to the semiconductor substrate. The second upper electrode may be formed by one of chemical vapor deposition and atomic layer deposition.

A method for fabricating a semiconductor device, in accordance with the present invention, includes forming a first interlayer dielectric on a substrate including a transistor, forming a first opening to expose a drain region of the transistor through the first interlayer dielectric and a second opening to expose a source region of the transistor through the first interlayer dielectric, filling the first opening and the second opening with a conductive material to form a first contact and a second contact, forming a second interlayer dielectric on the first interlayer dielectric including the first and second contacts, forming a concave hole to expose the first contact through the second interlayer dielectric, forming a lower electrode conductive layer in the concave hole and on the second interlayer dielectric, patterning the lower electrode conductive layer to form a lower electrode on a bottom and a sidewall of the concave hole, forming a dielectric film on the lower electrode, and forming an upper electrode on the dielectric film by physical vapor deposition and chemical vapor deposition.

In alternate embodiments, the method for fabricating a semiconductor device may further include forming a third interlayer dielectric on the second interlayer dielectric, forming a third opening to expose the upper electrode through the third interlayer dielectric and a fourth opening to expose the second contact, and filling the third opening and the fourth opening with a conductive material to form a third contact and a fourth contact. The step of forming the upper electrode may include forming a first upper electrode by chemical vapor deposition, and forming a second upper electrode by physical vapor deposition, or forming a first upper electrode by physical vapor deposition, and forming a second upper electrode the chemical vapor deposition. When the first upper electrode is formed the physical vapor deposition, a bias power may be applied only to a target and no bias power is applied to the substrate. The lower electrode may be cylindrical.

Another capacitor, in accordance with the present invention, includes a lower electrode formed on a semiconductor substrate, a dielectric film stacked on the lower electrode, and an upper electrode formed on the dielectric film, wherein the upper electrode is formed by physical vapor deposition and one of chemical vapor deposition and atomic layer deposition.

Another method for fabricating a capacitor, in accordance with the present invention, includes forming a lower electrode on a semiconductor substrate, forming a dielectric film on the lower electrode, and forming a upper electrode by physical vapor deposition and one of chemical vapor deposition and atomic layer deposition.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout the specification.

A semiconductor device including a concave-type capacitor according to the present invention is now described below with reference to FIG. 2.

Figure 2:
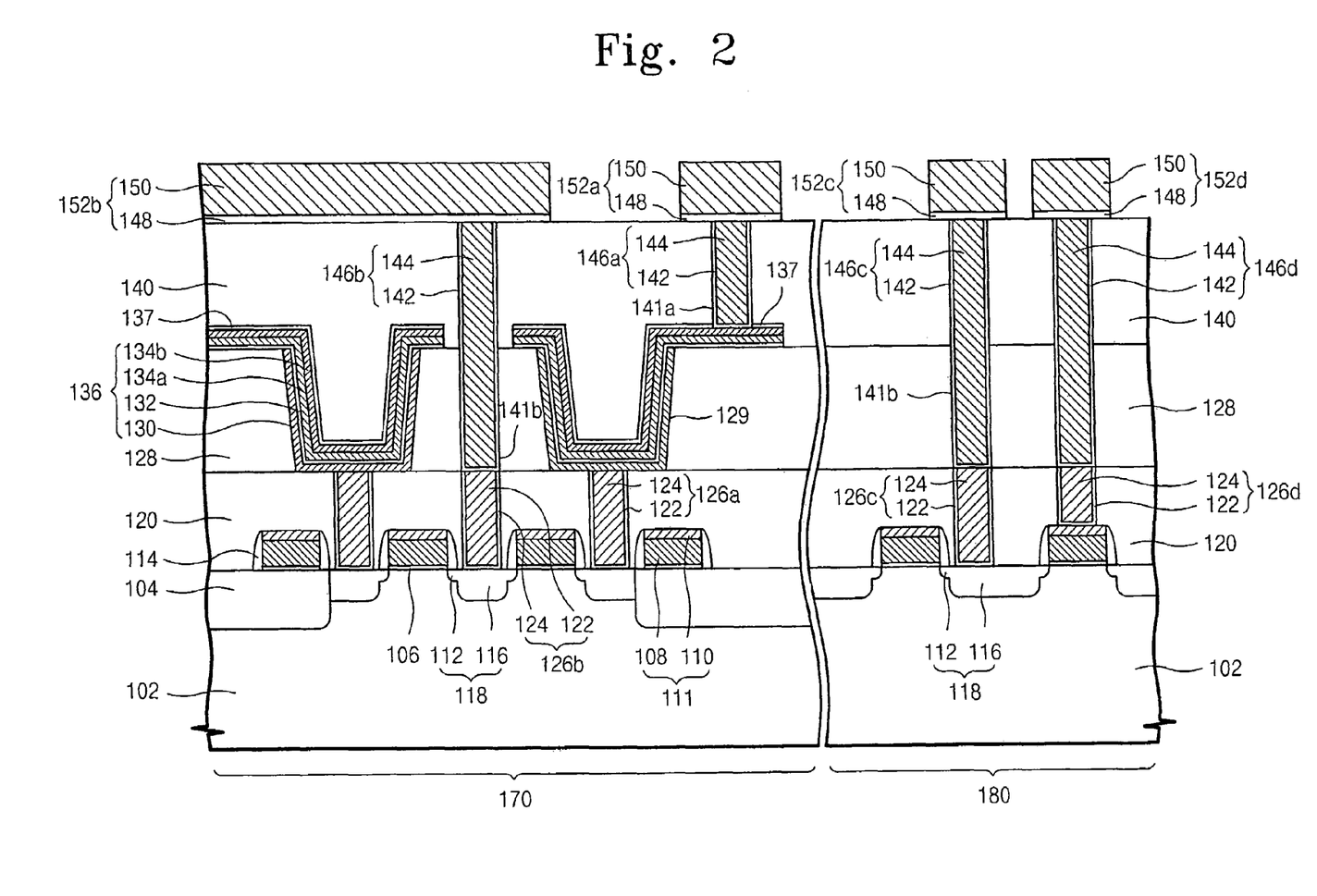
FIG. 2 is a cross-sectional view of a semiconductor device including a concave-type capacitor according to an embodiment of the present invention.

Referring to FIG. 2, in a cell region 170, a MOS transistor is disposed on a semiconductor substrate 102 where a device isolation region 104 is formed. The MOS transistor includes a gate electrode 111 and a source/drain region 118. The gate electrode 111 includes a polysilicon layer 108 and a silicide layer 110 formed on a gate insulating layer 106. A spacer 114 is formed on sidewalls of the gate electrode 111. The source/drain region 118 has a lightly doped region 112 and a heavily doped region 116. A first interlayer dielectric 120 is stacked on the substrate 102 including the MOS transistor. A storage contact 126a is connected to the source region 118 through the first interlayer dielectric 120. A contact 126b is connected to the drain region 118 through the first interlayer dielectric 120. Each of the contacts 126a and 126b includes barrier metal 122 and a tungsten layer 124. A second interlayer dielectric 128 is stacked on a first interlayer dielectric 120 including the contacts 126a and 126b. A concave hole 129 is formed to expose the storage contact 126a through the second interlayer dielectric 128. A capacitor 136 coupled to the storage contact 126a is disposed in the concave hole 129. The capacitor 136 includes a lower electrode 130, a dielectric film 132, a first upper electrode 134a, and a second upper electrode 134b. The first and second upper electrodes 134a and 134b may be formed by means of chemical vapor deposition (CVD) or physical vapor deposition (PVD), respectively, and vice versa. A third interlayer dielectric 140 is stacked on the second interlayer dielectric 128 where the capacitor 136 is formed. A contact 146a is electrically connected to the upper electrode 134 of the capacitor 136 through the third interlayer dielectric 140. The contact 146a is coupled to an interconnection 152a. A bitline contact 146b is electrically connected to the contact 126b through the third interlayer dielectric 140 and the second interlayer dielectric 128. The bitline contact 146b is coupled to a bitline 152b. The interconnection 152a includes barrier metal 148 and a conductive layer 150. Similarly, the bitline 152b includes barrier metal 148 and a conductive layer 150.

In a peripheral circuit region 180, a MOS transistor is disposed on a semiconductor substrate 102. A first interlayer dielectric 120 is stacked on the semiconductor substrate 102 including the MOS transistor. Contacts 126c and 126d are connected to a source/drain region 118 or a gate electrode 111 of the MOS transistor through the first interlayer dielectric 120. A second interlayer dielectric 128 and a third interlayer dielectric 140 are sequentially stacked on a first interlayer dielectric 120 including the contacts 126c and 126d. Contacts 146c and 146d are electrically connected to the contacts 126c and 126d through the third interlayer dielectric 140 and the second interlayer dielectric 128. The contacts 146c and 146d are coupled to interconnections 152c and 152d, respectively. The contacts 146a, 146b, 146c and 146d consist of barrier metal 142 and a tungsten layer 144.

The opening 141a, exposing the upper electrodes 134a and 134b of the capacitor, and the openings 141b, exposing the contacts 126b, 126c, and 126d, are formed at the same time. However, the upper electrodes 134a and 134b are resistant to overetching because the upper electrodes 134a and 134b are thick enough to resist overetching.

A method of forming a capacitor with the above-described structure is now described more fully below with reference to FIGS. 3 through 9, in which only parts related to the capacitor 136 are illustrated.

Figure 3:
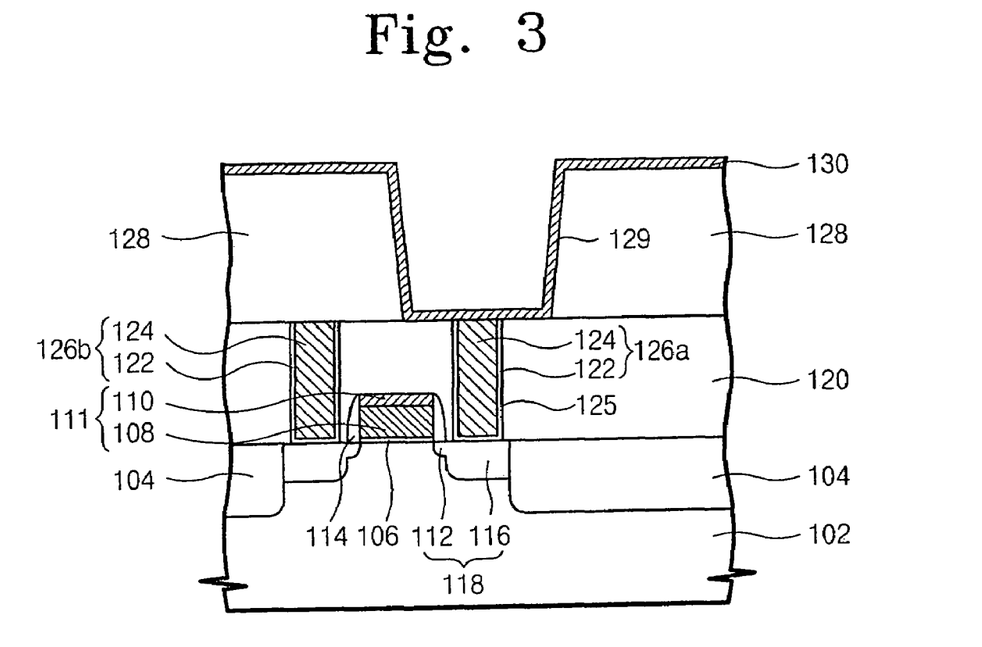
FIGS. 3 through 9 are cross-sectional views of a concave-type capacitor for explaining a method of forming same according to an embodiment of the present invention.

Referring to FIG. 3, a device isolation region 104 is formed at a semiconductor substrate 102 to define an active region. The gate insulating layer 106, a gate conductive layer 108, and a silicide layer 110 are sequentially stacked on the semiconductor substrate 102 where the device isolation region 104 is formed. The gate insulating layer 106, the gate conductive layer 108, and the silicide layer 110 are successively patterned to form a gate electrode 111. Using the gate electrode 111 and the device isolation region 104 as an ion implantation mask, a lightly doped region 112 is formed at the active region of the substrate 102. A spacer insulating layer is formed on an entire surface of the semiconductor substrate 102 where the gate electrode 111 is formed. By means of an anisotropic dry etch, the spacer insulating layer is removed to form a spacer 114 on sidewalls of the gate electrode 111. Using a gate electrode 111 including the spacer 114 and the device isolation region 104 as an ion implantation mask, a heavily doped region 116 is formed at the active region of the semiconductor substrate 102. The lightly and heavily doped regions 112 and 116 correspond to source/drain regions 118 of the MOS transistor. A first interlayer dielectric 120 is stacked on entire surface of the substrate 102 including the MOS transistor. The first interlayer dielectric 120 is selectively etched to form an opening 125 exposing the source/drain region 118. A barrier metal 122 and a tungsten layer 124 are stacked in the opening 125 and on the first interlayer dielectric 120. Continuously, the tungsten layer 124 and the barrier metal 122 are polished down to a top surface of the first interlayer dielectric 120 by means of chemical mechanical polishing (CMP) to form contacts 126a and 126b filling the opening 125. A second interlayer dielectric 128 is stacked on a first interlayer dielectric 120 including the contacts 126a and 126b. By means of a conventional photolithographic process, the second interlayer dielectric 128 is selectively etched to form an opening 129 exposing a surface of the contact 126a.

A lower electrode conductive layer 130 is conformally formed in the opening 129 and on the second interlayer dielectric 128. The lower electrode conductive layer 130 may be formed of one of polysilicon, metal nitrides, such as titanium nitride (TiN), tantalum nitride (TaN) and tungsten nitride (WN), noble metal, such as ruthenium (Ru), platinum (Pt) and iridium (Ir), and a combination thereof, with a thickness ranging from about 50 angstroms to about 2000 angstroms.

Figure 4:
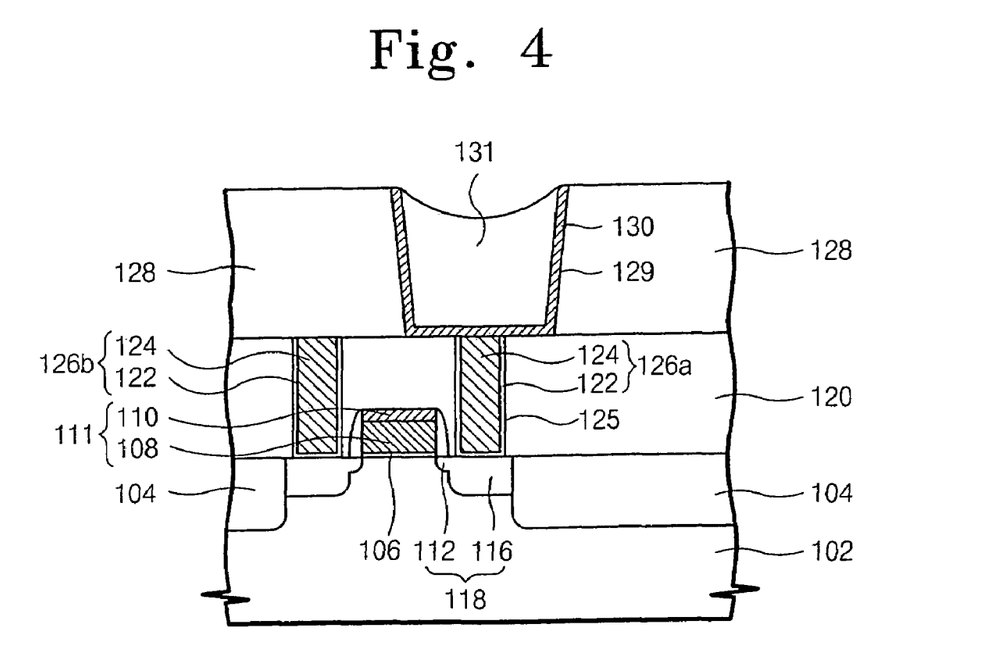

Referring to FIG. 4, a sacrificial layer 131 is formed on the lower electrode conductive layer 130 to sufficiently fill the opening 129. The sacrificial layer 131 may be formed of a photoresist layer or an oxide layer. The sacrificial layer 131 and the lower electrode conductive layer 130 are etched down to a top surface of the second interlayer dielectric 128 to form a lower electrode pattern 130. After formation of the lower electrode conductive layer 130, annealing in an oxygen ambient or a nitrogen-containing ambient (e.g., $NH_3$ plasma or $N_2$ plasma) or wet cleaning may be carried out.

Figure 5:
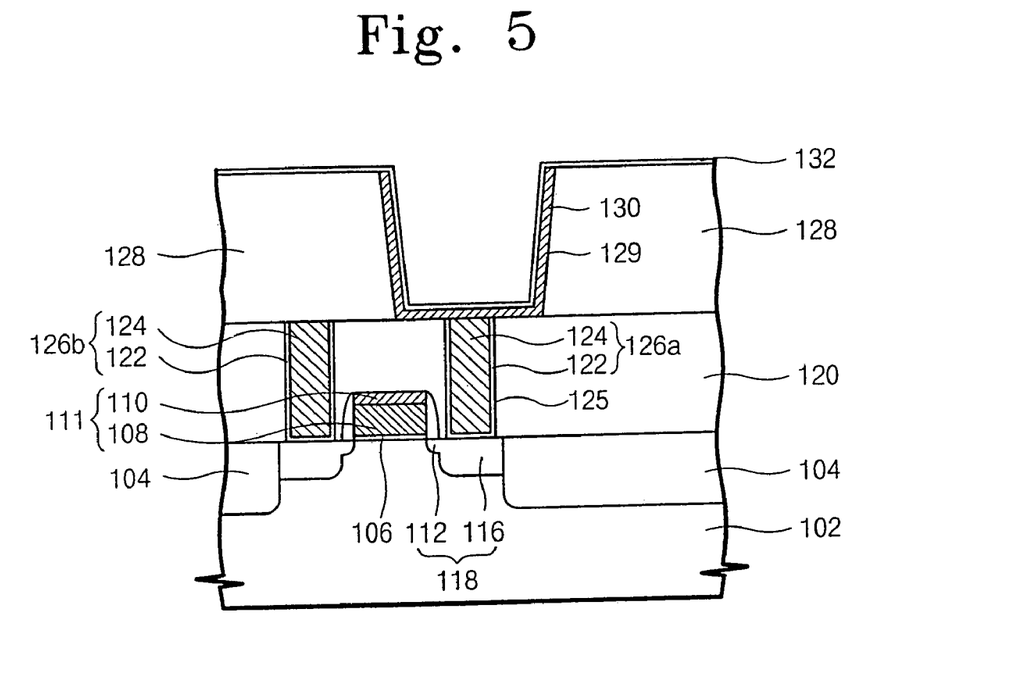

Referring to FIG. 5, the sacrificial layer 131 remaining in the opening is removed by means of a wet etch or a dry etch. The dielectric film 132 is conformally formed on the lower electrode pattern 130 and the second interlayer dielectric 128. The dielectric layer 132 may be made of one of silicon oxide ($SiO_2$), silicon nitride (SiN), aluminum oxide (AlO), tantalum oxide (TaO), titanium oxide (TiO), hafnium oxide (HfO), zirconium oxide (ZrO), BST, PZT, and a combination thereof, with a thickness ranging from about 10 angstroms to about 1000 angstroms. After formation of the dielectric layer 132, annealing may be carried out in an oxygencontaining ambient (e.g., $O_2$, $O_3$, $N_2O$ and $H_2O$) or in an inert gas ambient (e.g., $N_2$, Ar, etc.).

Figure 6:
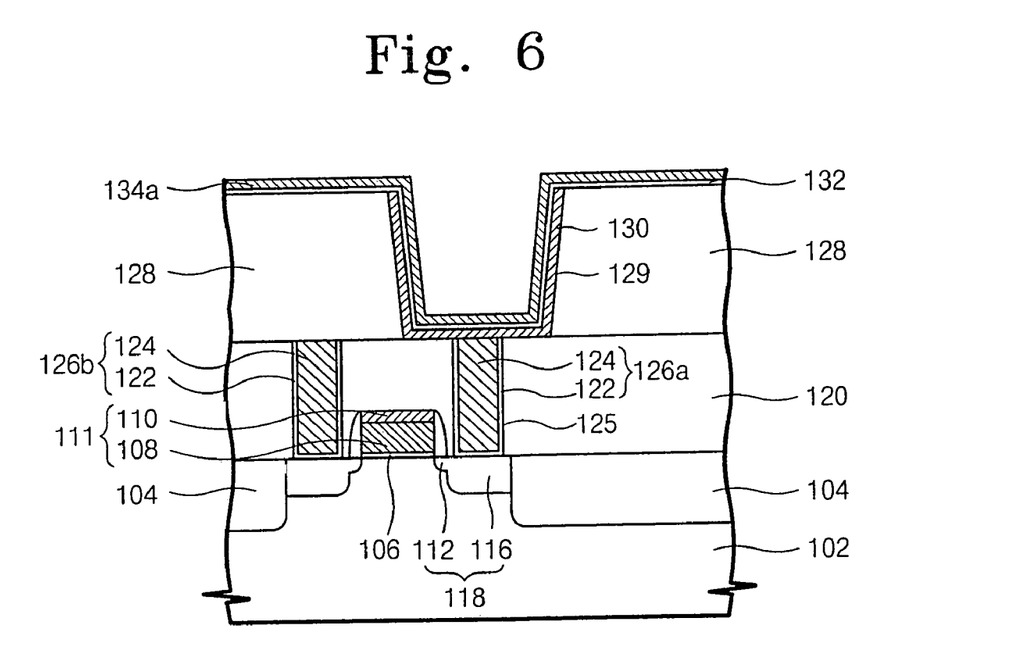

Referring to FIG. 6, a first upper electrode 134a is conformally formed on the dielectric layer 132. The first upper electrode 134a may be made of one of metal nitrides, such as titanium nitride (TiN), tantalum nitride (TaN), and tungsten nitride (WN), noble metal, such as ruthenium (Ru), platinum (Pt), and iridium (Ir), and a combination thereof, with a thickness ranging from about 100 angstroms to about 2000 angstroms, by means of CVD, atomic layer deposition (ALD) or PVD.

Figure 7:
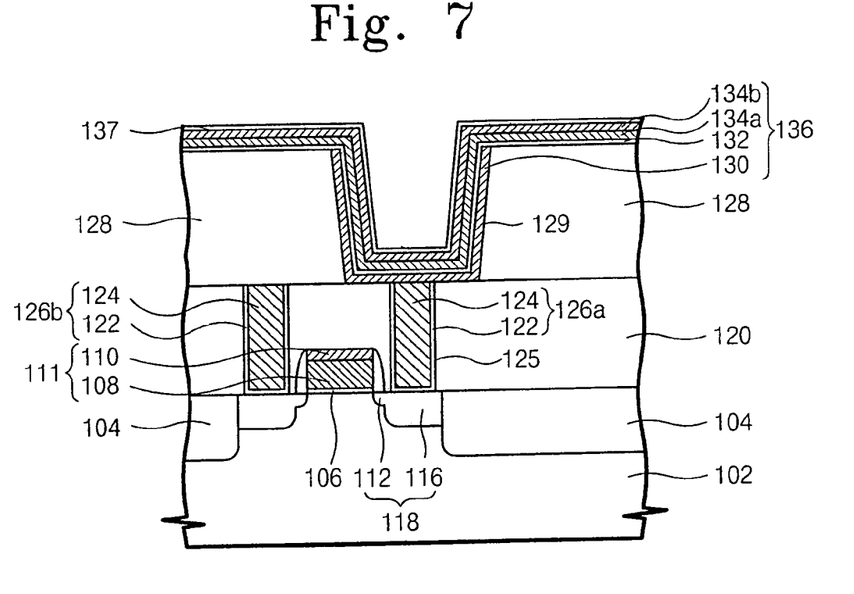

Referring to FIG. 7, a second upper electrode 134b is formed on the first upper electrode 134a. The method of forming the second upper electrode 134b may vary depending on the method of forming the first upper electrode 134a. In a case where CVD or ALD is used to form the first upper electrode 134a, PVD is used to form the second upper electrode 134b. In the case where PVD is used to form the first upper electrode 134a, CVD or ALD is used to form the second upper electrode 134b. As mentioned above, the upper electrode (i.e., the combination of the first upper and second upper electrodes 134a, 134b) is formed through the two steps using CVD or ALD and PVD. Therefore, a thicker upper electrode may be rapidly and conformally formed. An anti-reflective layer (ARL) 137, which is made of silicon nitride or silicon oxynitride, may be formed on the second upper electrode 134b. The ARL 137 may act as an etch-stop layer and have a thickness ranging from about 400 angstroms to about 500 angstroms.

Figure 8:
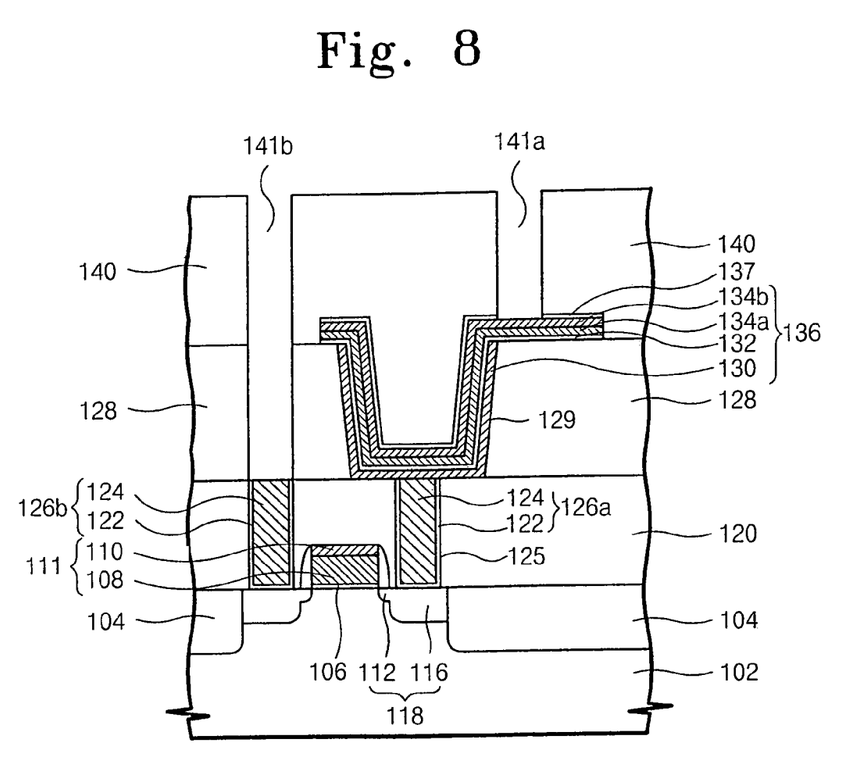

Referring to FIG. 8, a third interlayer dielectric 140 is formed on a second interlayer dielectric 128 including the capacitor 136. The third interlayer dielectric 140 is selectively etched to form an opening 141a exposing the upper electrode 134b of the capacitor. Simultaneously, the third interlayer dielectric 140 and the second interlayer dielectric 128 are etched to form an opening 141b exposing the contact 126b. The opening 141a is overetched but, as described above, the upper electrodes 134a and 134b are formed, by means of CVD or ALD and PVD, to be thick enough to resist overetching.

Figure 9:
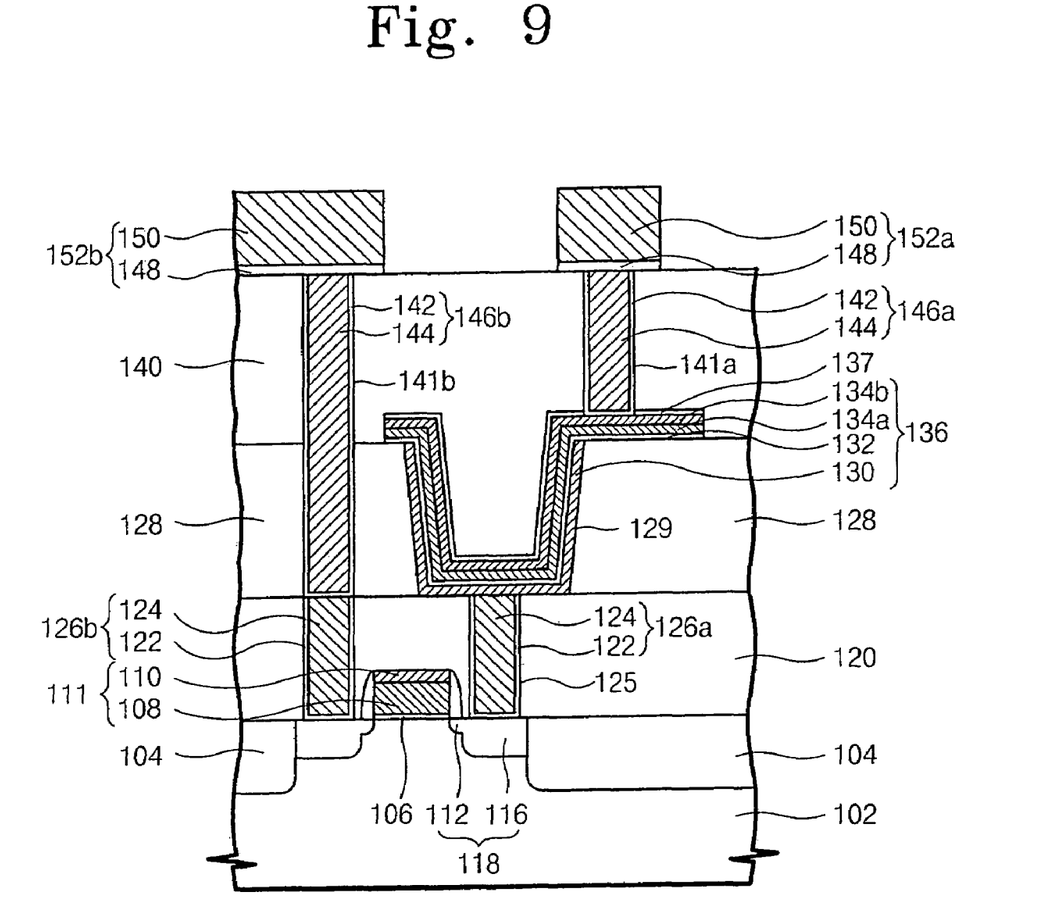

Referring to FIG. 9, a barrier metal 142 and a tungsten layer 144 are stacked in the openings 141a and 141b and on the third interlayer dielectric 140. A CMP process is performed down to a top surface of the third interlayer dielectric 140 to form contacts 146a and 146b. Barrier metal 148 and a conductive layer 150 are stacked on the third interlayer dielectric 140 including the contacts 146a and 146b, and are patterned to form an interconnection 152a and a bitline 152b.

The capacitor 136 according to the invention includes the lower electrode 130, a dielectric film 132, a first upper electrode 134a, and a second upper electrode 134b. The upper electrode of the capacitor 136 is formed by means of CVD or ALD, as well as PVD. That is, CVD or ALD is used to form a first upper electrode and then PVD is used to form a second upper electrode, and vice versa.

When PVD is used to form the first upper electrode 134a and then CVD is used to form the second upper electrode 134b, data retention characteristics while in the data "0" state are not deteriorated with the lapse of time. On the other hand, when a negative voltage is applied, leakage current is increased to deteriorate data retention characteristics while in the data "1" state.

Leakage current is increased due to plasma damage occurring when PVD is used to form a first upper electrode 134a. Accordingly, when PVD was used to form the first upper electrode 134a, experiments were conducted to measure leakage current characteristics in two cases. The first case is when bias power is applied only to a target, not to a semiconductor substrate and the second case is when bias power is applied to the target as well as the semiconductor substrate.

The capacitor used in the experiment was formed under the following conditions. A lower electrode was formed in a concave hole having a height of 8000 angstroms, a short axis width of 0.2 micrometers, and a long axis width of 0.5 micrometers. The lower electrode was made of titanium nitride (TiN) to a thickness of 200 angstroms by means of metal organic chemical vapor deposition (MOCVD).

Tantalum oxide (TaO) film was deposited as a dielectric film on the lower electrode to a thickness of 60 angstroms. An annealing process was performed in ozone ($O_3$) ambient. The tantalum oxide film was re-deposited on the resultant structure to a thickness of 90 angstroms by means of PVD. The annealing process was re-performed in ozone ambient.

As a first upper electrode, a titanium nitride (TiN) film was formed on the dielectric film to a thickness of 800 angstroms by means of PVD. As a second upper electrode, the titanium nitride film was formed on the first upper electrode to a thickness of 400 angstroms by means of MOCVD.

Figure 10:
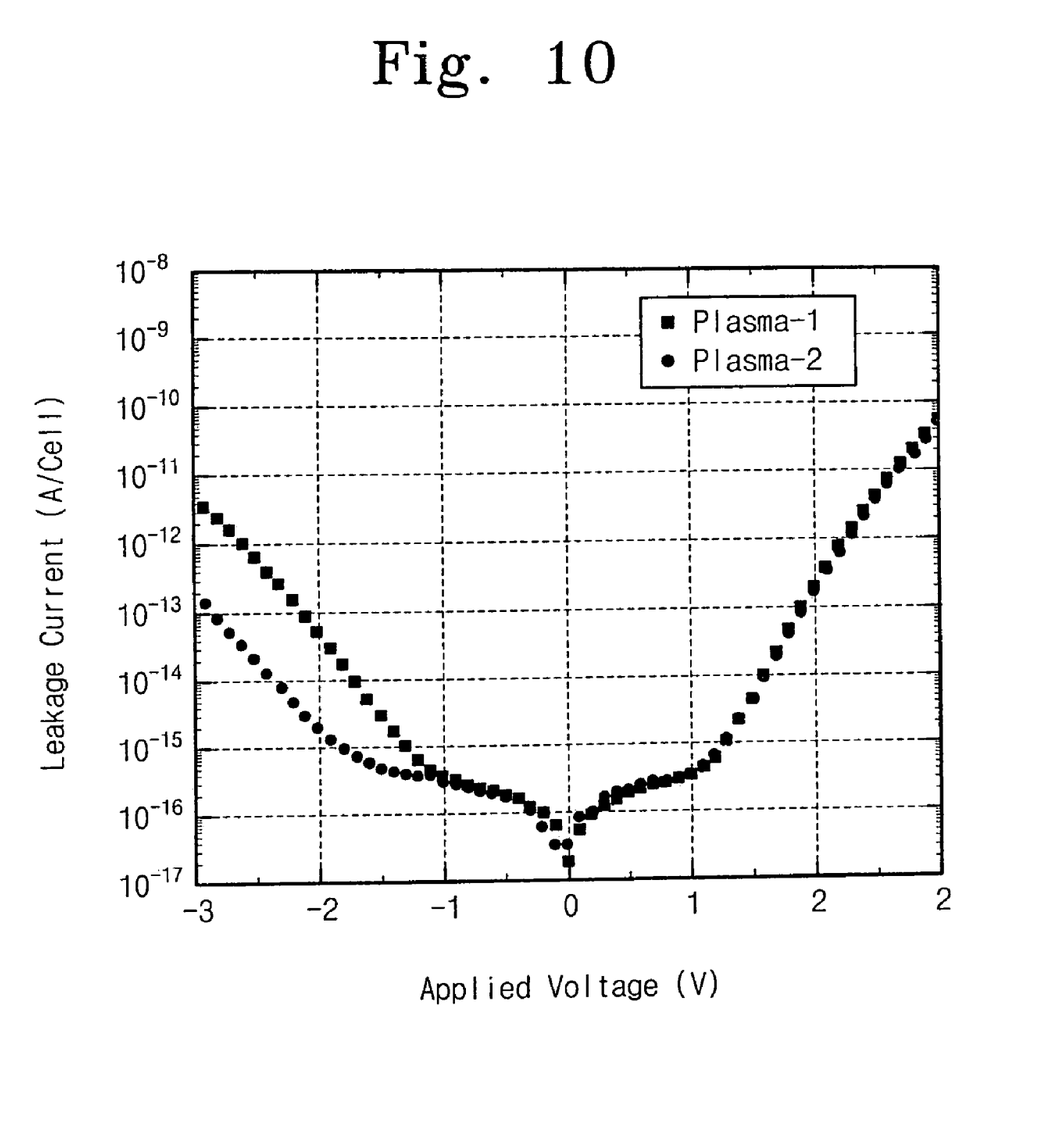
FIG. 10 is a graph of leakage current characteristics with respect to applied voltage when an upper electrode is formed by means of physical vapor deposition (PVD) according to an embodiment of the present invention.

FIG. 10 illustrates a graph showing leakage current characteristics of capacitors formed under the foregoing conditions. In the graph of FIG. 10, there are two cases related to the leakage current characteristics. One case is that a first upper electrode is formed without applying a bias power to a semiconductor substrate ("Plasma-1"), and the other is that a first upper electrode is formed by applying a bias power to a semiconductor substrate ("Plasma-2"). When a negative voltage is applied, there is notably less leakage current with respect to the "Plasma-2" electrode when compared to the "Plasma-1" electrode.

The following table ("Table 1") shows a thickness of a first upper electrode (hereinafter referred to as "PVD-TiN") and a thickness of a second upper electrode (hereinafter referred to as "CVD-TiN") at a short axis sidewall and at a bottom of a concave hole, under the foregoing conditions.

TABLE 1

| thickness of upper electrode (Å) | | Plasma-1 | | Plasma-2 | |
| --- | --- | --- | --- | --- | --- |
| Thickness on sidewall (Å) | PVD-TiN | 400 | ~0 | 470 | 70 |
| | CVD-TiN | | 400 | | 400 |
| thickness on bottom (Å) | PVD-TiN | 590 | 390 | 510 | 310 |
| | CVD-TiN | | 200 | | 200 |

As shown in Table 1, when the PVD-TiN is formed, a deposition thickness of the CVD-TiN is uniform at the bottom and sidewall of the concave hole (400 Å and 200 Å, respectively) irrespective of whether the bias power is applied to the semiconductor substrate or not.

When the PVD-TiN is formed on a sidewall of a concave hole, it has a thickness of about 70 angstroms under the "Plasma-2" conditions while having a thickness of zero (0) angstroms under the "Plasma-1" conditions.

As a result, the first electrode (PVD-TiN) is also formed on the sidewall of the concave hole under the "Plasma-2" to reduce leakage current. That is, the purity of the PVD-TiN is higher than that of the CVD-TiN, and the PVD-TiN is entirely deposited in the concave hole to reduce leakage current.

When an upper electrode is formed on a bottom of the concave hole, the upper electrode under the "Plasma-2" conditions is thinner than the upper electrode under the "Plasma-1" conditions. As the concave hole becomes narrower and the upper electrode deposited on the bottom of the concave hole becomes thicker, lifting of the upper electrode may more frequent. Under the "Plasma-2" conditions, therefore, a thinner upper electrode may be formed on the bottom of the concave hole to suppress the lifting.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for fabricating a capacitor, comprising:
   forming a lower electrode on a semiconductor substrate;
   forming a dielectric film on the lower electrode;
   forming an upper electrode comprising a first upper electrode formed on the dielectric film and a second upper electrode formed on the first upper electrode, wherein the second upper electrode is formed by physical vapor deposition with bias power applied to a target and no bias power applied to the semiconductor substrate, and wherein the first upper electrode is formed by one of chemical vapor deposition and atomic vapor deposition.

2. The method of claim 1, wherein the upper electrode is made of one selected from the group consisting of titanium nitride, tantalum nitride, tungsten nitride, ruthenium, platinum, iridium, and a combination thereof.

3. A method for fabricating a capacitor, comprising:
   forming an interlayer dielectric on a semiconductor substrate where a conductive region is formed;
   selectively etching the interlayer dielectric to form a concave hole exposing the conductive region;
   forming a lower electrode conductive layer in the concave hole and on the interlayer dielectric;
   patterning the lower electrode conductive layer to form a lower electrode pattern on a bottom and a sidewall of the concave hole;
   forming a dielectric film on the lower electrode pattern;
   forming a first upper electrode on the dielectric film by one of chemical vapor deposition and atomic vapor deposition; and
   forming a second upper electrode on the first upper electrode by physical vapor deposition, wherein a bias power is applied to a target and no bias power is applied to the semiconductor substrate.

4. A method for fabricating a semiconductor device, comprising:
   forming a first interlayer dielectric on a substrate including a transistor;
   forming a first opening to expose a drain region of the transistor through the first interlayer dielectric and a second opening to expose a source region of the transistor through the first interlayer dielectric;
   filling the first opening and the second opening with a conductive material to form a first contact and a second contact;
   forming a second interlayer dielectric on the first interlayer dielectric including the first and second contacts;
   forming a concave hole to expose the first contact through the second interlayer dielectric;
   forming a lower electrode conductive layer in the concave hole and on the second interlayer dielectric;
   patterning the lower electrode conductive layer to form a lower electrode on a bottom and a sidewall of the concave hole;
   forming a dielectric film on the lower electrode; and
   forming an upper electrode on the dielectric film, wherein the upper electrode includes an upper layer formed by physical vapor deposition and a lower layer formed by chemical vapor deposition.

5. The method of claim 4, further comprising:
   forming a third interlayer dielectric on the second interlayer dielectric;
   forming a third opening to expose the upper electrode through the third interlayer dielectric and a fourth opening to expose the second contact; and
   filling the third opening and the fourth opening with a conductive material to form a third contact and a fourth contact.

6. The method of claim 4, wherein when the upper layer is formed by the physical vapor deposition, a bias power is applied only to a target.

7. The method of claim 4, wherein when the upper layer is formed by the physical vapor deposition, no bias power is applied to the substrate.

8. The method of claim 4, wherein the lower electrode is cylindrical.

9. A method for fabricating a capacitor, comprising:
   forming a lower electrode on a semiconductor substrate;
   forming a dielectric film on the lower electrode;
   forming an upper electrode including a first electrode formed on the dielectric film and a second electrode formed on the first electrode, wherein the first electrode is formed by one of chemical vapor deposition and atomic lay deposition, and the second electrode is formed by physical vapor deposition, wherein a bias power is applied only to a target and no bias power is applied to the semiconductor substrate.

* * * * *